United States Patent [19]

Choi et al.

[11] Patent Number: 5,554,684

[45] Date of Patent: Sep. 10, 1996

[54] FORMING POLYIMIDE COATING BY SCREEN PRINTING

[75] Inventors: Jin-O Choi, Getzville; John A. Tyrell, Williamsville; Paul D. Dubell, Cheektowaga, all of N.Y.

[73] Assignee: Occidental Chemical Corporation, Niagara Falls, N.Y.

[21] Appl. No.: 357,894

[22] Filed: Dec. 16, 1994

Related U.S. Application Data

[63] Continuation-in-part of Ser. No. 134,707, Oct. 12, 1993.

[51] Int. Cl.$^6$ ............ C08L 83/08; C08L 83/04; D04H 1/16

[52] U.S. Cl. ............ 524/588; 524/538; 524/606; 524/607; 524/863; 524/864; 524/879; 427/282; 427/387; 427/393.5

[58] Field of Search ............ 427/282, 387, 427/393.5; 524/538, 588, 606, 607, 863, 864, 879

[56] References Cited

U.S. PATENT DOCUMENTS

| | | | |
|---|---|---|---|
| 3,568,012 | 3/1971 | Ernst et al. | 317/234 |
| 4,073,788 | 2/1978 | Peterson | 260/29.2 N |
| 4,369,090 | 1/1983 | Wilson et al. | 156/644 |
| 4,692,272 | 9/1987 | Goswami et al. | 252/514 |
| 4,829,131 | 5/1989 | Lee | 525/426 |
| 5,317,049 | 5/1994 | Rojstaczer et al. | 524/104 |

FOREIGN PATENT DOCUMENTS

| | | |
|---|---|---|
| 0224680A2 | 10/1987 | European Pat. Off. . |
| 01113434 | 5/1989 | Japan . |
| 03157427 | 7/1991 | Japan . |
| 03197530 | 8/1991 | Japan . |

OTHER PUBLICATIONS

Article: "Wet Etch Patterning of Polyimide Siloxane For Electronic Applications" G. C. Davis and C. L. Fasoldt, Proceedings of Second International Conf. on Polyimides: Synthesis, Characterization and Application, Ellenville, NY (1985), pp. 381–388.

Article: "Patternable Silicone Polyimide Copolymers", D. A. Bolan et al., Polyimides: Mater. Chem. Chacter., Proc. Tech. Conf. Polyimides, 3rd, Elsevier, Amsterdam (1989), pp. 103–114.

Article: "Etching of Partially Cured Polyimide", C. E. Diener and J. R. Susko, Polyimides: Synth. Character. Appl., Proc. Tech. Conf. Polyimides, 1st, (1982) edited by K. L. Mittal, vol. 1, Plenum, New York (1984), pp. 353–364.

*Primary Examiner*—John C. Bleutoe
*Assistant Examiner*—Margaret W. Glass
*Attorney, Agent, or Firm*—Richard D. Fuerle

[57] ABSTRACT

Disclosed is a method of forming a polyimide coating in a pattern on a surface. A first solution is prepared of an organic solvent, and diamine and dianhydride monomers. The monomers are polymerized to form a polyamic acid that is soluble in the organic solvent. About 10 to about 95% of the amic acid groups in the polyamic acid are imidized, forming a partially imidized polyamic acid. A more concentrated solution of the partially imidized polyamic acid is prepared and about 0.1 to about 10 wt % of a thixotrope is mixed with the more concentrated solution to form a paste. A template is placed over the surface and the paste is forced through the template onto the surface. The solvent is evaporated and the partially imidized polyamic acid on the surface is fully imidized.

18 Claims, 1 Drawing Sheet

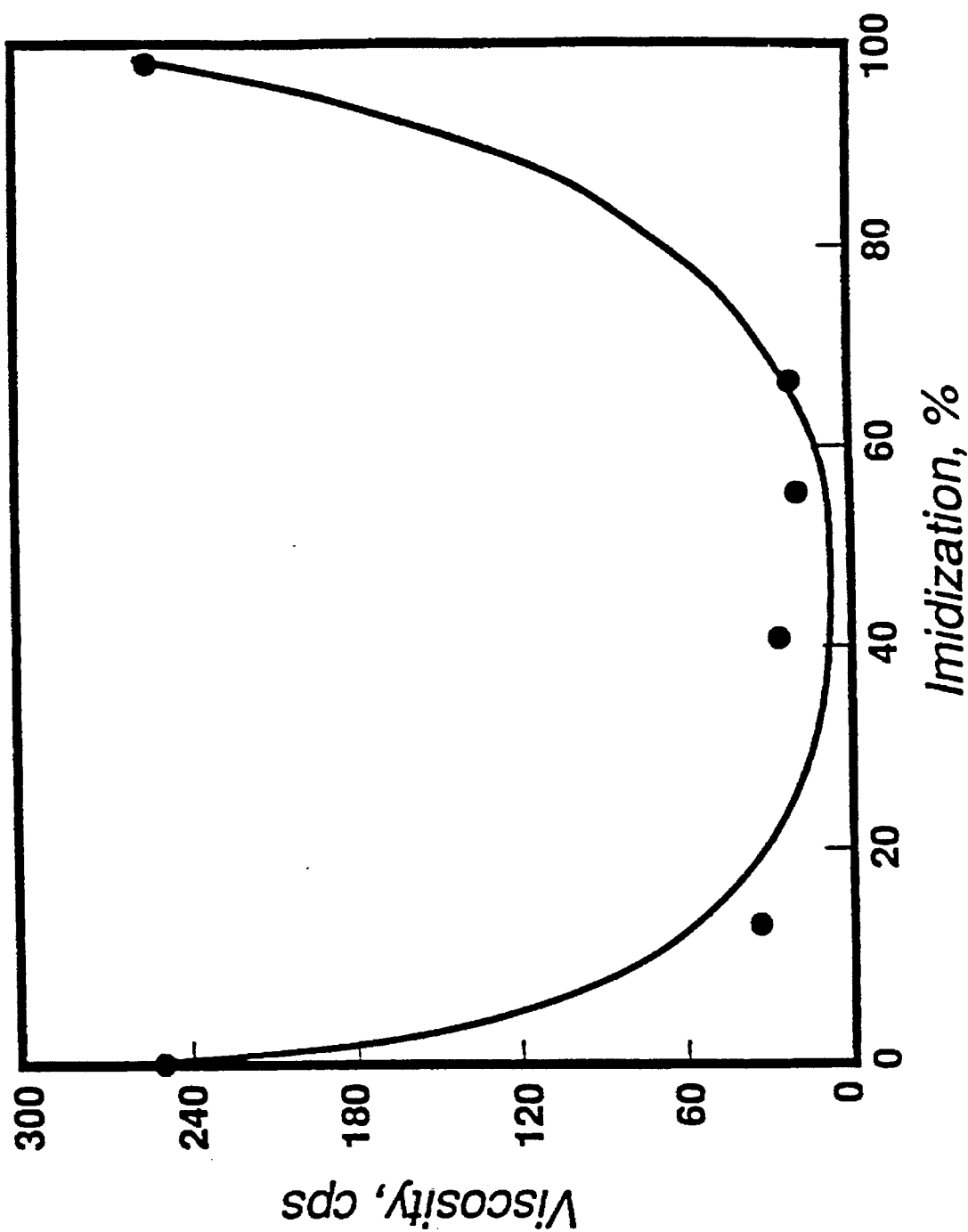

FORMING POLYIMIDE COATING BY SCREEN PRINTING

BACKGROUND OF THE INVENTION

This application is a continuation-in-part of application Ser. No. 08/134,707, filed Oct. 12, 1993, by Jin-O Choi titled "METHOD OF FORMING POLYIMIDE PATTERNS ON SUBSTRATES."

This invention relates to the formation of polyimide patterns on surfaces. In particular, it relates to forcing a paste containing a concentrated solution of a partially imidized polyamic acid through a template onto a substrate, then fully imidizing the patterned coating on the substrate.

Because of their excellent thermal, insulation, and adhesion properties, polyimides are used as passivation, buffer, or dielectric coatings in semiconductor fabrication. Patterns of polyimide coatings can be made photographically, by incorporating a photosensitizer into the precursor polyamic acid, coating a substrate, partially imidizing the coating, exposing the coating to a pattern of ultraviolet light, dissolving exposed or unexposed portions, and imidizing the remaining polyamic acid. A pattern can also be made photographically by placing a coating of a photoresist over a partially imidized polyamic acid coating, exposing the photoresist coating to a pattern of ultraviolet light, dissolving exposed or unexposed photoresist coating as well as the polyamic acid coating underneath the dissolved photoresist coating, and imidizing the remaining polyamic acid. In both methods, several steps of pattern processing, including ultraviolet exposure, are necessary.

SUMMARY OF THE INVENTION

One of us has discovered that when a polyamic acid is partially imidized it becomes more soluble in organic solvents. That is, as the percent of imidization increases from zero, the viscosity of the partially imidized polyamic acid decreases to a minimum and then, as 100% imidization is approached, either increases again or the polyamic acid becomes insoluble in any solvent. As a result of this unusual phenomenon, it is possible to form solutions of higher solids content by partially imidizing the polyamic acid. Because the solutions have a higher solids content, coatings on substrates which are less shrinkable can be obtained. Thus, while in the prior art solutions of polyamic acid, with or without sensitizer, were applied to substrates and then partially imidized on the substrates, in the method of this invention the solutions of polyamic acids are partially imidized and then concentrated before they are applied to the substrate.

In order to obtain a high solids content solution suitable for screen printing, the partially imidized polyamic acid is recovered from the solution in which it was prepared and a more concentrated solution is formed by redissolving the partially imidized polyamic acid in an organic solvent. A thixotropic agent is added to the more concentrated solution to form a paste. A polyamic acid pattern is formed by forcing the paste through a template onto a substrate, and the solvent is evaporated. The partially cured polyamic acid coating is fully cured to form a polyimide coating pattern. In this way, we are able to obtain polyimide coatings without using ultraviolet light which shrink less than patterns made with polyamic acid coatings.

BRIEF DESCRIPTION OF THE DRAWING

The accompanying drawing is a graph showing the relationship between percent imidization of a polyamic acid and its viscosity.

DESCRIPTION OF THE PREFERRED EMBODIMENTS

In the first step of the process of this invention, a first solution is prepared of monomers in an organic solvent. Suitable organic solvents include N-methylpyrrolidone (NMP), dimethylacetamide (DMAC), 2-vinyl pyrrolidone, acetone, benzene, toluene, xylene, "Cellosolve" or glycol ethyl ether, "Cellosolve acetate" or hydroxyethyl acetate glycol monoacetate, diethyl ether or dichloromethane, dimethyl formamide (DMF), ethyl alcohol, methyl isobutyl ketone, methyl ethyl ketone, sulfolane, dimethyl sulfoxide (DMSO), hexamethylphosphoramide (HMPA), tetramethyl urea (TMU), diethyleneglycol diethyl ether, 1,2-dimethoxyethane or monoglyme, diethylene glycol dimethyl ether or bis(2methoxyethyl) ether, 1,2-bis(2-methoxyethoxy ethane, bis [2-(2-methoxyethoxy) ethyl)] ether, triglyme, or tetraglyme, tetrahydrofuran, m-dioxane, and p-dioxane. NMP, DMAC, and triglyme are preferred as they are good solvents for polyamic acids.

Dianhydride and diamine monomers are used to form the polyamic acid. In this invention, these monomers do not contain photosensitive groups.

DIANHYDRIDE MONOMER

Any dianhydride or combination of dianhydrides can be used as the dianhydride monomer in forming the polyimide, although aromatic dianhydrides are preferred as they give superior properties. Examples of suitable dianhydrides include
1,2,5,6-naphthalene tetracarboxylic dianhydride;
1,4,5,8-naphthalene tetracarboxylic dianhdyride;
2,3,6,7-naphthalene tetracarboxylic dianhydride;
2-(3', 4'-dicarboxyphenyl) 5,6-dicarboxybenzimidazole dianhydride;
b 2-(3', 4'-dicarboxyphenyl) 5,6-dicarboxybenzoxazole dianhydride;
2-(3', 4'dicarboxyphenyl) 5,6-dicarboxybenzothiazole dianhydride;
2,2',3,3'-benzophenone tetracarboxylic dianhydride;
2,3,3',4'-benzophenone tetracarboxylic dianhydride;
3,3',4,4'-benzophenone tetracarboxylic dianhydride (BTDA);
2,2',3,3'-biphenyl tetracarboxylic dianhydride;
2,3,3',4'-biphenyl tetracarboxylic dianhydride;
3,3',4,4'-biphenyl tetracarboxylic dianhydride (BPDA);
bicyclo-[2,2,2]-octen-(7)-2,3,5,6-tetracarboxylic-2,3,5,6-dianhydride;
thio-diphthalic anhydride;
bis (3,4-dicarboxyphenyl) sulfone dianhydride;
bis (3,4-dicarboxyphenyl) sulfoxide dianhydride;
bis (3,4-dicarboxyphenyl oxadiazole-1,3,4) paraphenylene dianhydride;
bis (3,4-dicarboxyphenyl) 2,5-oxadiazole 1,3,4-dianhydride;
bis 2,5-(3',4'-dicarboxydiphenylether) 1,3,4-oxadiazole dianhydride;
bis (3,4-dicarboxyphenyl) ether dianhydride or 4,4'-oxydiphthalic anhydride (ODPA);
bis (3,4-dicarboxyphenyl) thioether dianhydride;
bisphenol A dianhydride;
bisphenol S dianhydride;
2,2-bis (3,4-dicarboxyphenyl) hexafluoropropane dianhydride or 5,5-[2,2,2-trifluoro-l-(trifluoromethyl)ethylidene]bis-1,3-isobenzofurandione) (6FDA);
hydroquinone bisether dianhydride;

bis (3,4-dicarboxyphenyl) methane dianhydride;
cyclopentadienyl tetracarboxylic acid dianhydride;
cyclopentane tetracarboxylic dianhydride;
ethylene tetracarboxylic acid dianhdyride;
perylene 3,4,9,10-tetracarboxylic dianhydride;
pyromellitic dianhydride (PMDA);
tetrahydrofuran tetracarboxylic dianhydride; and resorcinol dianhydride.

The preferred dianhydrides are ODPA, BPDA, BTDA, 6FDA, and PMDA or mixtures thereof, as these dianhydrides are readily available and have been found to give superior properties. The dianhydrides can be used in their tetraacid form or as mono, di, tri, or tetra esters of the tetra acid, but the dianhydride form is preferred because it is more reactive.

DIAMINE MONOMER

If a polyimide is to be prepared, the diamine monomer does not contain siloxane. The non-siloxane containing diamine should be aromatic as those diamines give the best properties. Examples of suitable diamines include
m- and p-phenylenediamine (PDA);
2,5-dimethyl-1,4-phenylenediamine;
2,4-diaminotoluene (TDA);
2,5- and 2,6-diaminotoluene;
p- and m-xylenediamine;
4,4'-diaminobiphenyl;
4,4'-diaminodiphenyl ether or 4,4'-oxydianiline (ODA);
4,4'-diaminobenzophenone;
3,3',3,4', or 4,4'-diaminophenyl sulfone or m,m-, m,p- or p,p-sulfone dianiline;
4,4'-diaminodiphenyl sulfide;
3,3'or 4,4'-diaminodiphenylmethane or m,m- or p,p-methylene dianiline;
3,3'-dimethylbenzidine;
α,α'-bis(4-aminophenyl)-1,4-diisopropyl benzene or 4,4'-isopropylidenedianiline or bisaniline p;
α,α'-bis(4-aminophenyl)-1,3-diisopropyl benzene or 3,3'-isopropylidonedianiline or bisaniline m;
1,4-bis(p-aminophenoxy)benzene;
1,3-bis(p-aminophenoxy)benzene;
4,4'-bis(4-aminophenoxy)biphenyl;
1,3-bis(3-aminophenoxy)benzene (APB);
2,4-diamine-5-chlorotoluene;
2,4-diamine-6-chlorotoluene;
2,2-bis(4[4-aminophenoxy]phenyl)propane (BAPP);
trifluoromethyl-2,4-diaminobenzene;
trifluoromethyl-3,5-diaminobenzene;
2,2'-bis(4-aminophenyl)-hexafluoropropane (6F diamine);
2,2'-bis(4-phenoxy aniline) isopropylidene;
2,4,6-trimethyl-1,3-diaminobenzene;
4,4'-diamino-2,2'-trifluoromethyl diphenyloxide;
3,3'-diamino-5,5'-trifluoromethyl diphenyloxide;
4,4'-trifluoromethyl-2,2'-diaminobiphenyl;
2,4,6-trimethyl-1,3-diaminobenzene; diaminoanthraquinone;
4,4'-oxybis[2-trifluoromethyl)benzeneamine](1,2,4-OBA-BTF);
4,4'-oxybis[3-trifluoromethyl)benzeneamine];
4,4'-thiobis[(2-trifluoromethyl)benzeneamine];
4,4'-thiobis[(3-trifluoromethyl)benzeneamine];
4,4'-sulfoxylbis[(2-trifluoromethyl)benzeneamine];
4,4'-sulfoxylbis[(3-trifluoromethyl)benzeneamine];
4,4'-ketobis[(2-trifluoromethyl)benzeneamine];
4,4'-[(2,2,2-trifluoromethyl-1-(trifluoromethyl)-ethylidine)bis(3-trifluoromethyl)benzeneamine].

The preferred aromatic diamines are ODA, TDA, APB and BAPP, or a combination of these, due to their excellent properties.

SILOXANE MONOMER

It is preferable to prepare a polyimidesiloxane by using as part of the monomer about 1 to about 80 mole percent, based on total diamine monomers, of a monomer that contains siloxane. The siloxane-containing monomers can be either aromatic or non-aromatic, but non-aromatic monomers are preferred as they are more readily available. The siloxane-containing monomer is preferably a diamine, but it could also be a dianhydride. If the siloxane containing monomer is a diamine, it is preferably about 1 to about 80 mole percent of the total diamines. Examples of siloxane diamines that can be used include compounds having the formula

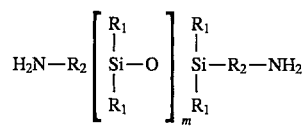

Examples of siloxane dianhydrides that can be used include compounds having the formula

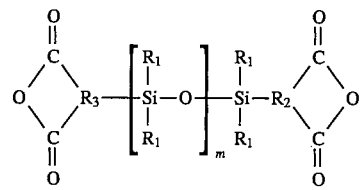

where $R_1$, $R_2$, and $R_3$ are mono, di, and triradicals, respectively, each independently selected from a substituted or unsubstituted 1 to 12 carbon atom aliphatic group or a substituted or unsubstituted 6 to 10 carbon atom aromatic 5 group. Examples of monoradicals include $-CH_3$, $-CF_3$, $-CH=CH_2$, $-(CH_2)_n CF_3$, $-C_6H_5$, $-CF_2-CHF-CF_3$, and

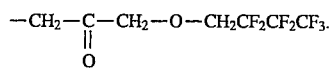

Examples of diradicals include $-(CH_2)_n-$, $-(CH_2)_n-$, $-CF_2-$ and $-C_6H_4-$. Examples of triradicals include $=CH-CH_2-$,

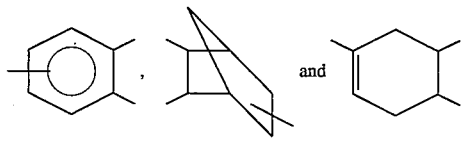

where "n" is 1 to 10 and "m" is 1 to 200, but is preferably 1 to 12. (Siloxane diamines are herein denoted by the notation "$G_m$".)

FIRST SOLUTION OF PARTIALLY IMIDIZED POLYAMIC ACID

Generally, stoichiometric quantities of diamine and dianhydride monomers are used to obtain polyimides of the highest molecular weight, but the equivalent ratio of dianhydride to diamine can range from 1:2 to 2:1. A polyimidesiloxane can be made from about 1 to about 80 mole percent siloxane-containing monomers and about 20 to about 99 mole percent monomers that do not contain siloxane. Preferably, they are made from about 1 to about 70 mole percent siloxane-containing monomers and about 30 to about 99 mole percent monomers that do not contain siloxane. The first solution of the monomers in the solvent is about 5 to about 20 wt % solids, where "solids" means components other than the solvent.

Upon the addition of the monomers to the solvent, polymerization will occur at room temperature to form the polyamic acid. The solution is then partially imidized. This can be accomplished chemically by, for example, the addition of acetic anhydride, or by heating, preferably at about 130 to about 170° C. About 10 to about 95%, and preferably about 20 to about 90%, of the amic acid groups are imidized as if fewer than 10% are imidized the viscosity of the solution is still high and if more than 95% are imidized some of the partially imidized polyamic acids may be too viscous or too insoluble and the viscosity of the solution is again too high. The optimal amount of imidization will depend upon the particular polyamic acid and can be determined by experimentation. The amount of imidization that has occurred can be determined by infrared spectrum analysis, by measuring the amount of water given off in forming the imide groups, or by heating predetermined times, drying, and titrating the polyamic acid to determine the relationship between the heating time and the percent imidization. The amount of heat necessary to achieve a particular percent imidization will depend upon the particular monomers used.

SECOND SOLUTION OF PARTIALLY IMIDIZED POLYAMIC ACID

Once the polyamic acid has been partially imidized, a more concentrated solution can be prepared without precipitating the polyamic acid since the partially imidized polyamic acid is more soluble than the unimidized polyamic acid. A more concentrated solution can be prepared by gently heating under vacuum at about 80 to about 130° C. to evaporate solvent. However, it is preferably prepared by precipitating the partially imidized polyamic acid from the first solution, preferably by the addition of water. The precipitated partially imidized polyamic acid is collected, usually by filtration, and can be washed (e.g., in methanol) and dried, if desired. It is then dissolved in a second organic solvent, preferably NMP or DMAC, to form the second, more concentrated solution. The steps of recovering the partially imidized polyamic acid from the first solution and redissolving it in a second solvent are preferable to form a high solids solution because the first solution cannot be easily concentrated by evaporation of the solvent without imidizing at least some of the polyamic acid. The more concentrated solution is about 20 to about 60 wt % solids. If the second solution is less than 20 wt % solids the solution is too thin and if it is over 60 wt % solids the solution is too viscous to apply easily to the substrate; it is preferable to form a second solution of about 30 to about 60 wt % solids.

PASTE

A paste is formed by the addition of about 0.1 to about 10 wt % (based on solution weight) of a thixotrope to the second solution. The amount of thixotrope is preferably about 0.5 to about 5 wt % as if less thixotrope is used the paste may flow to unwanted areas and if more is used it is difficult to spread the paste. Examples of thixotropes that can be used include fumed silica, smectite clay, organic clay, castor oil-based additives, and polymer-based additives. The preferred thixotrope is fumed silica because it is readily available and imparts the desired flow properties.

OPTIONAL COMPONENTS

If the coating is to be used to protect the surface, it is preferable to include about 0.5 to about 5 wt % (based on solution weight) of a crosslinking agent in the second solution to crosslink the polymer and form a more protective surface. Examples of suitable crosslinking agents include di- and tri- functional compounds such as triethoxysilylpropylethylcarbamate, N-[3-(triethoxysilylpropyl] phthalamic acid, N-(triethoxysilylpropyl) urea, and trimethoxysilylpropyl cinnamate. If the coating is to be used as an adhesive, a crosslinking agent is preferably not included. Other than that, a composition to be used as an adhesive is the same as a composition to be used as a coating.

If the coating is to be used for protective purposes, it is also preferable to include a pigment in the second solution so that one can easily determine which areas have been coated. About 0.1 to about 2 wt % (based on solution weight) of a pigment can be used. Examples of suitable pigments include antimony oxide, blue lead, calcium sulfate, chrome yellow, chromium oxide green, iron oxide, carbon black, ochre, sienna, titanium dioxide, toluidine red, zinc yellow, zinc sulfide, zinc oxide, and zirconium oxide.

The composition also preferably includes about 100 ppm to about 5 wt % (based on second solution weight) of a surfactant, which acts as a leveling agent or anti-foaming agent to reduce bubbling and help level the coating. Preferably, the surfactant is non-ionic as non-ionic surfactants seem to work and contain less ion impurity. The amount of surfactant is preferably 0.05 to about 1 wt %. Examples of suitable surfactants include fluoroaliphatic polymeric esters sold by 3M Corporation as "FC-430," a solution of foam destroying polymers, believed to be 8% hydroxy acetic acid butyl ester, 71% Stoddard solvent, 1% 2-butoxyethanol and 20% polyether sold by BYK Chemie as "BYK-051," a combination of foam destroying polymers, believed to be 50% naphtha-light aromatic, 7% 1-methoxy-2-propanol acetate and some dialkyl adipate, sold by BYK Chemie as "BYK-A501," silicone compound sold by Dow Corning as "DC-1400," alkylaryl polyether alcohol sold by Aldrich Chemical Co. as "Triton X-100," and a solution of foam destroying compounds, believed to be polypropylene glycol, ester, silica and aliphatic petroleum distillates sold by Drew Industrial Co. as "DrewPlus L-435."

FORMING A PATTERN

A pattern can be formed on the surface of a substrate by forcing the paste through a template which contains openings in the shape of the desired pattern. Examples of templates that can be used include stencils and screens with some of the openings blocked. Screen printing is preferred as it results in a higher resolution pattern. Screens are made of stainless steel, polyester, or other appropriate material and have typical mesh sizes of about 325 to about 165. The template is placed over the surface of the substrate on which the pattern is to be formed and the paste is forced through the template by brushing or other means. The coating can be applied to various types of surfaces including metal plates, silicon nitride, silicon dioxide, aluminum, and copper, but is most usefully applied to microelectronic components such as silicon wafers. For example, the coating can be applied as a protective coating over a chip or it can be applied as an adhesive coating to which various components can later be attached using heat and pressure. The solvent can be evaporated from the paste by soft baking the paste on the substrate, typically at 90 to 120° C. The coating can be fully imidized by heating at about 90 to about 350° C. for about 1 to about 12 hours. A typical cured coating is about 10 to about 20 microns thick.

The following examples further illustrate this invention.

EXAMPLE 1

To a 500 mL 3-necked flask equipped with a mechanical stirrer, a reflux condenser and a thermometer, 48.2 g (0.155 mol) of 4,4'-oxydiphthalic anhydride and 11 g of 1,3-bis(3aminopropyl) terminated polydimethylsiloxane were dissolved in 500 mL N-methyl pyrrolidone and a reaction was run for 4 hours. Then 40.8 g (0.14 mol) of 1,3-bis(3aminophenoxy)benzene was added and the polymerization was run for 16 hours. The viscosity of the polyamic acid, measured by Brookfield Viscometer LVT, was 246 cps. For the partial imidization, the temperature was raised to 160° C. To measure viscosity and the partial imidization by titrating the carboxylic acid group with 0.1 N tetrabutyl ammonium hydroxide, samples were taken out at 3, 6, and 15 minutes during the azeotropic distillation at 160° C. The fully imidized (98.4%) sample was obtained from the same polyamic acid solution in NMP and toluene by the azeotropic distillation at 165° C for 5 hours. The imidized solution was precipitated in water and washed with methanol. The dry resin was redissolved in NMP at 16.7% concentration. The viscosity versus the percent imidization is shown in the following table and in the accompanying drawing. As the imidization proceeded, the visocity decreased and then increased again near full imidization.

| Imidization % | 0% | 13.7% | 41.3% | 55.8% | 67% | 98.4% |
|---|---|---|---|---|---|---|
| Viscosity | 246 | 30 | 22.5 | 17.5 | 19 | 251 |

The partially imidized solution was precipitated in methanol, filtered, and dried in a vacuum oven at 60° C. Samples of the dry resin having different percentages of imidization were redissolved in NMP to give solutions having a viscosity of about 250 cps. The percent imidization vs. concentration of those solutions is shown in the following table.

| Imidization % | 0 | 61 | 68 | 72.5 | 98.4 |
|---|---|---|---|---|---|
| Concentration % | 16.9 | 32.7 | 35.7 | 26.8 | 16.6 |

The table shows that a higher solid content solution could be obtained from the partially imidized resin, compared to the polyamic acid and the fully imidized polyimide.

The 65% imidized solution was precipitated in methanol and dried in a vacuum oven at 60° C. When dissolving the dry resin in N-methyl pyrrolidone, a high solid content solution (30 to 50%) was obtained.

EXAMPLE 2

To a 2000 ml 3-necked flask fitted with a mechanical stirrer, a reflux condenser, and a thermometer, 241 g of ODPA and 55 g of 1,3-bis(3-aminopropyl) terminated polydimethyldisiloxane were dissolved in 2.8 liters of NMP. The reaction ran for 4 hours then 204 g APB was added and the monomers were polymerized for 16 hours at room temperature to produce a polyamic acid. For the partial imidization, the solution of polyamic acid was mixed with 500 ml of toluene and was azeotropically distilled for 30 minutes at 156° C. The partially imidized resin was precipitated in deionized water, filtered, and dried at room temperature. From titrating residual acid, the imidization was determined to be 75%.

The dry resin was dissolved in triglyme to form a 50% solution. To 40 g of the solution was added 0.4 g of fumed silica at a high speed. A defoamer, 0.5 wt % "DC-1400," 0.6 wt % carbon black pigment, and 4 wt % N-(triethoxysilyl propyl) urea (crosslinker), were mixed in thoroughly.

Screen printing was performed with the formulated paste by placing a 325 mesh stainless steel screen over a ceramic substrate substrate and forcing the paste through the screen using a squeegee. The screen printed substrates were baked for 30 minutes at 80, 150, and 250° C. The substrates were immersed in boiling methylene chloride for 8 minutes. The screen printed coating did not swell and was not damaged.

EXAMPLE 3

The dry resin prepared in Example 2 was dissolved in triglyme at 50% concentration and mixed thoroughly with 1 wt % fumed silica and 0.5 wt % of "DC-1400," a defoaming agent. Screen printing was performed as in Example 1 on ceramic coupons and the coupons were baked at 120 and 250° C. for 30 minutes. Small chips, 3/16×"3/16", were bonded onto the screen printed substrates at 350° C and 28 psi for 1 minute to evaluate the bonding strength of the resin. At 25 Kg shear stress, the chips still adhered to the printed substrates.

EXAMPLE 4

To a 1 liter 3-necked flask, 500 ml of NMP, 30.3 g of BPDA and 13.75 g of BTDA were added. After adding 14 g of 1,3-bis(3-aminopropyl) terminated polydimethyldisiloxane in a 1 to 3 molar ratio of G to $G_9$ the reaction was allowed to proceed for 4 hours at room temperature. Then, with the addition of 39 g of BAPP and 4 g of 2,5-dimethyl-1,4-phenylenediamine, the solution was polymerized for 16 hours at room temperature to produce a polyamic acid. To the solution of polyamic acid 90 ml of toluene was added, the temperature was raised to 152° C., and the solution was azeotroped for 30 minutes. The resin was precipitated into deionized water, filtered, and dried at room temperature. The imidization was 72%.

The dry resin, 3 g, was dissolved in 6 g of NMP and 0.09 g of fumed silica was mixed in thoroughly along with 0.045 g of "DC-1400," and 0.005 g of carbon black as a pigment. With the formulated paste, screen printing was performed as in Example 2, and the printed substrates were baked for 30 minutes at 80, 150, and 250° C. respectively The substrates were immersed in boiling methylene chloride for 8 minutes but did not swell.

EXAMPLE 5

To a 5 liter 3-necked flask, 2.5 l of NMP, 375 ml of toluene, 176 g of BTDA and 290 g of 1,3-bis(3-aminopropyl) terminated polydimethyldisiloxane ($G_{12}$) were added. After reacting for 4 hours at room temperature, 34.4 g of TDA was added and the monomers were polymerized for 16 hours to produce a polyamic acid. The temperature was raised to 160° C. for azeotropic distillation for 90 minutes. After cooling to room temperature, the solution was precipitated into water and the resin was filtered and dried under air flow. The imidization was 90%.

The dry resin, 10 g, was dissolved in 10 g triglyme and the solution was mixed thoroughly with 0.8 g of fumed silica, 0.8 g N-(triethoxysilyl propyl)urea, a crosslinker, and 0.05 g of "Drew Plus L-435." As in Example 2, the formulated paste was screen printed onto ceramic substrates, which were baked at 60, 120, and 200° C. for 30 minutes. Patterns were made of various widths. Good patterns were obtained for widths of 50 mils or more.

EXAMPLE 6

To a 2 liter flask, 20.3 g of p-phenylene diamine and 3 g of bis(3-aminopropyl)tetramethyldisiloxane were completely dissolved in 1080 ml NMP and then 58.8 g of BPDA was added. After the polymerization proceeded at room temperature overnight, 240 ml of toluene was mixed with the polyamic acid and the temperature was raised to 150° C. After azeotroping for 5 minutes, the reactor was cooled down in an ice bath. The partially imidized resin was precipitated in deionized water and the filtered resin was dried under air flow. The dry resin, 3 g, was redissolved in 7 ml NMP and the solution was mixed with 0.1 g of fumed silica and 0.05 g of "DC-1400" by using a high speed mixer. The formulated paste was screen-printed printed onto a ceramic substrate, which then was baked for 30 minutes at 80, 150, and 250° C., and cured at 350° C. for an hour. To test for chemical resistance the cured sample was boiled in methylene chloride for 8 minutes. The screen printed coatings showed no damage.

I claim:

1. A method of forming a polyimide coating on the surface of substrate comprising
   (A) forming a first solution which comprises
      (1) organic solvent; and
      (2) monomers of
         (a) diamine; and
         (b) dianhydride, tetracarboxylic acid, or ester of tetracarboxylic acid;
   (B) polymerizing said monomers to form a polyamic acid soluble in said organic solvent;
   (C) imidizing 10 to 90% of the amic acid groups in said polyamic acid to form a partially imidized polyamic acid;
   (D) forming a more concentrated solution of said partially imidized polyamic acid, wherein said more concentrated solution is formed by either 1) heating said first solution of partially imidized polyamic acid under vacuum at about 80 to about 130° C. to evaporate said organic solvent or by 2) precipitating said partially imidized polyamic acid from said first solution and forming a second solution having a solids content of 20 to 60 wt % by dissolving said partially imidized polyamic acid in an organic solvent;
   (E) forming a paste which comprises said more concentrated solution of said partially imidized polyamic acid mixed with about 0.1 to about 10 wt % a based on the weight of said paste, of a thixotrope;
   (F) placing a template over said surface;
   (G) forcing said paste through said template onto said surface;
   (H) evaporating the solvent from said paste on said surface; and
   (I) fully imidizing said partially imidized polyamic acid on said surface to form said polyimide coating.

2. A method according to claim 1 wherein said template is a screen.

3. A method according to claim 1 wherein said partially imidized polyamic acid is about 20 to about 90% imidized.

4. A method according to claim 1 wherein said substrate is a microelectronic component.

5. A method according to claim 1 wherein said thixotrope is silica.

6. A method according to claim 1 wherein said paste includes about 100 ppm to about 5 wt %, based on the weight of said paste, of a surfactant.

7. A method according to claim 1 wherein said dianhydride is selected from the group consisting of pyromellitic dianhydride, 3,3',4,4'-benzophenone tetracarboxylic dianhydride, 3,3',4,4'-biphenyl tetracarboxylic dianhydride, bis(3,4-dicarboxyphenyl) ether dianhydride, and 2,2-bis(3,4-dicarboxyphenyl)hexafluoropropane dianhydride.

8. A method according to claim 1 wherein said diamine monomer is a mixture of diamines that contain siloxane groups and diamines that do not contain siloxane groups.

9. A method according to claim 8 wherein said diamine that does not contain siloxane groups is selected from the group consisting of 4,4'-oxydianiline, 2,4-diaminotoluene, 1,3-bis(3-aminophenoxy)benzene, and 2,2-bis[4-aminophenoxy]phenyl propane.

10. A method according to claim 8 wherein said siloxane-containing diamine has the general formula

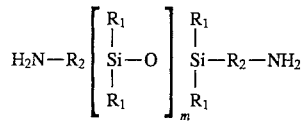

where $R_1$ and $R_2$ are mono and diradicals, respectively, each independently selected from 1 to 12 carbon aliphatic groups or 6 to 10 carbon atom aromatic groups, and "m" is from 1 to 200.

11. A method of forming a polyimidesiloxane coating on the surface of a substrate comprising
   (A) forming a first solution of about 5 to about 20 wt % solids which comprises
      (1) organic solvent; and
      (2) monomers of
         (a) diamine, and
         (b) dianhydride, tetracarboxylic acid, or ester of tetracarboxylic acid, where about 1 to about 80 mole percent of said monomers contain siloxane groups;
   (B) polymerizing said monomers to form a polyamic acid soluble in said organic solvent;
   (C) imidizing 20 to 90% of the amic acid groups in said polyamic acid to form a partially imidized polyamic acid;
   (D) separating said partially imidized polyamic acid from said first solution;
   (E) forming a second solution of said partially imidized polyamic acid which is more concentrated than said first solution and has a solids content of about 20 to about 60 wt %, based on the weight of said second solution, and wherein said more concentrated solution is formed by either 1) heating said first solution of partially imidized polyamic acid under vacuum at about 80° to about 130° C. to evaporate said organic solvent or by 2) precipitating said partially imidized polyamic acid from said first solution and forming a second solution having a solids content of to 60 wt % by dissolving said partially imidized polyamic acid in an organic solvent;
   (F) forming a paste which comprises said second solution and about 0.1 to about 10 wt %, based on the weight of said paste, of a thixotrope;
   (G) placing a screen over said surface;

(H) forcing said paste through said screen onto said surface;

(I) evaporating the solvent from said paste on said surface; and (J) fully imidizing said partially imidized polyamic acid on said surface to form said polyimide coating.

12. A method according to claim 11 wherein all the monomers that contain siloxane groups are diamines.

13. A method according to claim 12 wherein said diamine that does not contain siloxane groups is selected from the group consisting of 4,4'-oxydianiline, 2,4-diaminotoluene, 1,3-bis(3-aminophenoxy)benzene, and 2,2bis-[4-aminophenoxy]phenyl propane.

14. A method of forming a polyimidesiloxane pattern on the surface of a substrate comprising (A) preparing a first solution of about 5 to about 20 wt % solids in an organic solvent of approximately equal molar amounts of diamine and dianhydride, where said dianhydride is selected from the group consisting of pyromellitic dianhydride, 3,3',4,4'-benzophenone tetracarboxylic dianhydride, 3,3',4,4'-biphenyl tetracarboxylic dianhydride, bis(3,4-dicarboxyphenyl) ether dianhydride, and 2,2-bis(3,4-dicarboxyphenyl)-hexafluoropropane dianhydride, said diamine is about 30 to about 99 wt % non-siloxane containing diamine selected from the group consisting of 4,4'-oxydianiline, 2,4-diaminotoluene, 1,3-bis(3-aminophenoxy)benzene, and 2,2-bis[4-aminophenoxy]phenyl propane and about 1 to about 70 wt % siloxane containing diamine which has the general formula

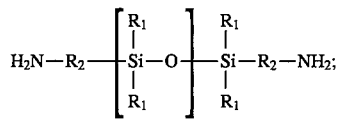

where each $R_1$ is a monoradical independently selected from a substituted or unsubstituted 1 to 12 carbon atom aliphatic group or a substituted or unsubstituted 6 to 10 carbon atom aromatic group and each $R_2$ is a diradical independently selected from a substituted or unsubstituted 1 to 12 carbon atom aliphatic group or a substituted or unsubstituted 6 to 10 carbon atom aromatic group;

(B) heating said first solution to about 130 to about 170° C. to form a solution of polyamic acid that is 20 to 90% imidized;

(C) precipitating said partially imidized polyamic acid and separating it from said solution;

(D) dissolving said precipitated partially imidized polyamic acid in an organic solvent to form a more concentrated solution having a solids content of about 30 to about 60 wt %, based on the weight of said more concentrated solution;

(E) preparing a paste by mixing about 0.1 to about 10 wt %, based on the weight of said paste, of a thixotrope with said more concentrated solution;

(F) screen printing said paste onto a surface;

(G) evaporating the solvent from said paste to form a coating on said surface; and (H) fully imidizing said partially imidized polyamic acid on said surface.

15. A method according to claim 14 wherein said paste includes about 0.5 to about 5 wt %, based on the weight of said paste, of a crosslinking agent.

16. A method according to claim 14 wherein said paste contains no crosslinking agent and is used as an adhesive.

17. A method according to claim 14 wherein said paste includes about 0.1 to about 2 wt %, based on the weight of said paste, of a pigment.

18. A method according to claim 14 wherein said paste includes about 100 ppm to about 5 wt %, based on the weight of said paste, of a surfactant.

* * * * *

UNITED STATES PATENT AND TRADEMARK OFFICE
CERTIFICATE OF CORRECTION

PATENT NO.  : 5,554,684
DATED       : September 10, 1996
INVENTOR(S) : Jin-O Choi et al.

It is certified that error appears in the above-identified patent and that said Letters Patent is hereby corrected as shown below:

In Claim 14, line 18, in the formula, after the brackets, insert -- m --

In Claim 14, line 22, delete "and" and insert a comma

In Claim 14, line 26, after "group" insert -- , and m is 1 to 200 --

Signed and Sealed this

Seventeenth Day of August, 1999

Attest:

Q. TODD DICKINSON

Attesting Officer    Acting Commissioner of Patents and Trademarks

UNITED STATES PATENT AND TRADEMARK OFFICE
CERTIFICATE OF CORRECTION

PATENT NO. : 5,554,684
DATED : September 10, 1996
INVENTOR(S) : Jin-O Choi et al.

It is certified that error appears in the above-identified patent and that said Letters Patent is hereby corrected as shown below:

In Claim 14, line 16, change "70 wt %" to -- 80 mole percent --

Signed and Sealed this

Second Day of January, 2001

Attest:

Attesting Officer

Q. TODD DICKINSON
Commissioner of Patents and Trademarks